United States Patent
Yen et al.

(10) Patent No.: US 7,772,912 B2
(45) Date of Patent: Aug. 10, 2010

(54) LEVEL SHIFT CIRCUIT AND METHOD THEREOF

(75) Inventors: Yu-Jen Yen, Sinshih Township, Tainan County (TW); Wen-Teng Fan, Sinshih Township, Tainan County (TW); Chien-Ru Chen, Sinshih Township, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 11/939,314

(22) Filed: Nov. 13, 2007

(65) Prior Publication Data

US 2009/0121771 A1 May 14, 2009

(51) Int. Cl.
*H03L 5/00* (2006.01)

(52) U.S. Cl. ............................ 327/333; 327/306

(58) Field of Classification Search .................. None
See application file for complete search history.

(56) References Cited

U.S. PATENT DOCUMENTS

| | | | | |
|---|---|---|---|---|
| 5,821,800 A * | 10/1998 | Le et al. | ...................... | 327/333 |
| 6,333,662 B1 * | 12/2001 | Umezawa et al. | ............ | 327/333 |
| 6,369,632 B1 * | 4/2002 | Barnes | ........................ | 327/211 |
| 6,489,828 B1 * | 12/2002 | Wang et al. | .................. | 327/333 |
| 6,512,407 B2 * | 1/2003 | Horan et al. | ................. | 327/333 |
| 6,933,755 B2 * | 8/2005 | Hong et al. | .................. | 327/108 |
| 7,397,296 B1 * | 7/2008 | Kiani | ......................... | 327/333 |
| 2001/0003511 A1 * | 6/2001 | Taura et al. | ............. | 365/185.23 |
| 2005/0007176 A1 * | 1/2005 | Seki | ........................... | 327/333 |
| 2007/0146042 A1 * | 6/2007 | Tsuchi et al. | ............... | 327/333 |
| 2007/0236272 A1 * | 10/2007 | Min et al. | .................... | 327/333 |
| 2007/0241804 A1 * | 10/2007 | Campardo et al. | .......... | 327/333 |
| 2007/0247209 A1 * | 10/2007 | Chen | .......................... | 327/333 |

* cited by examiner

*Primary Examiner*—Cassandra Cox
(74) *Attorney, Agent, or Firm*—J.C. Patents

(57) ABSTRACT

A level shift circuit comprises a first input terminal, a second input terminal, a first output terminal, a second output terminal, a level shifter and an equalization unit. The first and second input terminals receive an input signal and an inverted input signal respectively. The first and second output terminals output an output signal and an inverted output signal respectively. The level shifter is connected to the first and second input terminals, the first and the second output terminals. The equalization unit is coupled between the first and second output terminals. Wherein, at a reset phase, the input signal and the inverted input signal are inputted to the level shifter, and the equalization unit is turned on. After the reset phase, the equalization unit is turned off and the level shifter starts to shift a level of the input signal.

8 Claims, 5 Drawing Sheets

LEVEL SHIFT CIRCUIT AND METHOD THEREOF

BACKGROUND OF THE INVENTION

1. Field of Invention

The present invention generally relates to a level shift circuit and method thereof, and more particularly to a level shift circuit and method thereof in the LCD display apparatus.

2. Description of Prior Art

The source driver of the display has plural channels for driving data lines of the display. Each channel has level shift circuits for converting a low-voltage signal into a high-voltage signal. FIG. 1 is a schematic diagram showing a conventional level shift circuit 10. The level shift circuit 10 comprises P-MOS transistors MP1~MP3 and N-MOS transistors MN1 and MN2. The level shift circuit 10 converts the low-voltage input signals input_sig and /input_sig into the high-voltage output signals OUT and /OUT.

The P-MOS transistors MP1 and MP2 receives the supply voltage VDDA via the P-MOS transistor MP3 which is controlled by the enable signal ENLS. The gate of the P-MOS transistor MP1 is coupled to the output terminal B, and the gate of the P-MOS transistor MP2 is coupled to output terminal A.

The N-MOS transistor MN1 is connected between the output terminal A and the ground terminal GND and controlled by the input signal /input_sig, generated by the inverter 101. The N-MOS transistor MN2 is connected between the output terminal B and controlled by the input signal input_sig. The resistor GND_LOAD is a parasitic resistor of conduction lines to emulate ground loading.

When the enable signal ENLS enable the level shift circuit 10 (i.e. ENLS=LOW) and the input signal input_sig is high, the transistors MN2 and MP1 are turned on, and the transistors MN1 and MP2 are turned off. Thus the output terminal A is pulled high, and the output terminal B is pulled low. In another state when the enable signal ENLS enable the level shift circuit 10 (i.e. ENLS=LOW) and the input signal input_sig is low, the transistors MN2 and MP1 are turned off, and the transistors MN1 and MP2 are turned on. Thus the output terminal A is pulled low, and the output terminal B is pulled high.

With the increasing size of the LCD display apparatus, the channel number of the source driver in the LCD apparatus also increases. The plural level shift circuits 10 change states simultaneously, and thus the total current flowing to the ground GND is large. Since there exists the parasitic resistor GND_LOAD, the voltage at node G' is higher than the ground voltage and thus the voltage Vgs between gate and source of the N-MOS transistor MN1 or MN2 is smaller, which may cause the N-MOS transistor MN1 or MN2 fail to turn on.

FIG. 2 is a plot diagram showing the waveforms of the first and second output signals OUT and /OUT when the level shift circuit 10 fails. The curve 20 represents the voltage amplitude of the enable signal ENLS. The curve 21 represents the voltage amplitude of the output signal OUT at the output terminal A, and the curve 22 represents the voltage amplitude of the second output signal /OUT at the output terminal B.

Suppose that the input signal input_sig is logic high. During the transient state of the level shift circuit 10, the enable signal ENLS is first at a high level and then is asserted to a low level to enable the level shift circuit 10. When level shift circuit 10 is not enabled (the enable signal ENLS is high), the input signals input_sig and /input_sig is inputted and the output signal OUT goes from high to low (see the curves 20 and 21) because the transistor MN1 is turned on by the input signal /input_sig. The output signal /OUT is pulled to a level lower than ground since it is coupled to a low voltage by the output signal OUT through MP2 (see the circle mark 23, and the curve 22). Therefore at the next step when the level shift circuit 10 is enabled (the enable signal ENLS is at the low level), the transistor MP1 has a stronger driving than the transistor MP2, which makes the first output signal OUT be erroneously pulled high while it should be pulled low, such that the level shift circuit 10 fails.

SUMMARY OF THE INVENTION

Accordingly, the present invention is directed to a level shift circuit and method thereof for better performance.

The present invention provides a level shift circuit, and the level shift circuit comprises a first input terminal, a second input terminal, a first output terminal, a second output terminal, a level shifter and an equality switch. The first input terminal receives an input signal, and the second input terminal receives an inverted input signal which is an inverse of the input signal. The first output terminal outputs an output signal, and the second output terminal outputs an inverted output signal. The level shifter is connected to the first input terminal, the second input terminal, the first output terminal and the second output terminal. The equalization unit is coupled between the first output terminal and the second output terminal. Wherein, at a reset phase, the input signal and the inverted input signal are inputted to the level shifter, and the equalization unit is turned on. After the reset phase, the equalization unit is turned off and the level shifter starts to shift a level of the input signal.

The present invention provides a method used in a level shift circuit for level shifting. The method comprises the following steps: (a) receiving an input signal and an inverted input signal with respect to a first and a second input terminal, wherein the inverted input signal is an inverse of the input signal; (b) providing a first output terminal and a second output terminal, wherein the first output terminal is used to output an output signal and the second output terminal is used to output an inverted output signal; (c) providing a level shifter which is connected to the first input terminal, the second input terminal, the first output terminal and the second output terminal; (d) electrically connecting the first output terminal and the second output terminal by turning on an equalization unit at a reset phase; (e) after the reset phase, turning off the equalization unit and shifting levels of the input signal and the inverted input signal for outputting the output signal and the inverted output signal.

According to an embodiment of the present invention provides a level shift circuit and method thereof suitable for the condition with higher channels, higher supply voltage VDDA, lower supply voltage VDDD and higher loading resistance of the ground terminal. The method and level shift circuit are simple to be implemented, and their hardware complexity and manufacturing cost are low.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
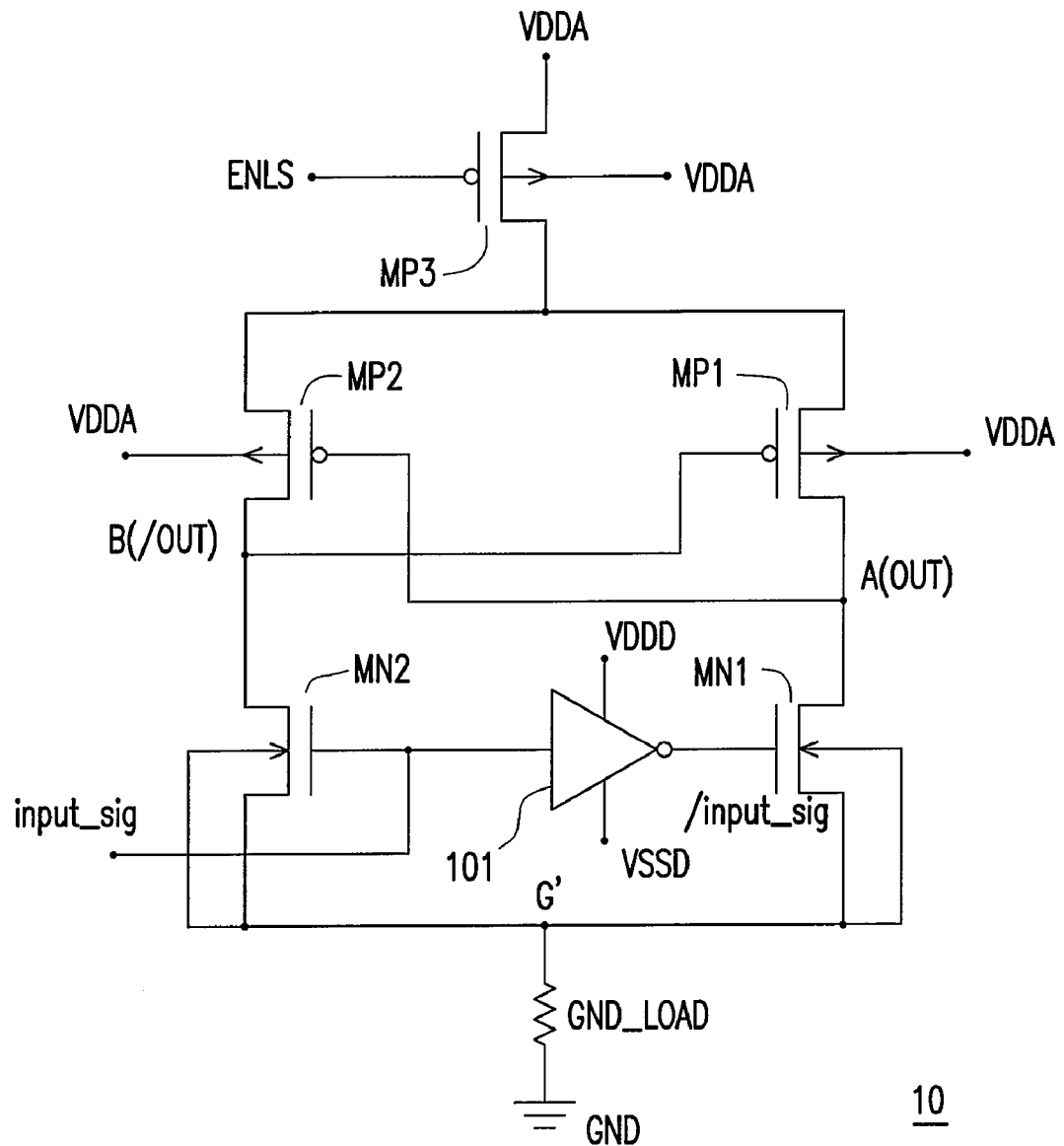
FIG. 1 is a schematic diagram showing a conventional level shift circuit 10.
Figure 2:
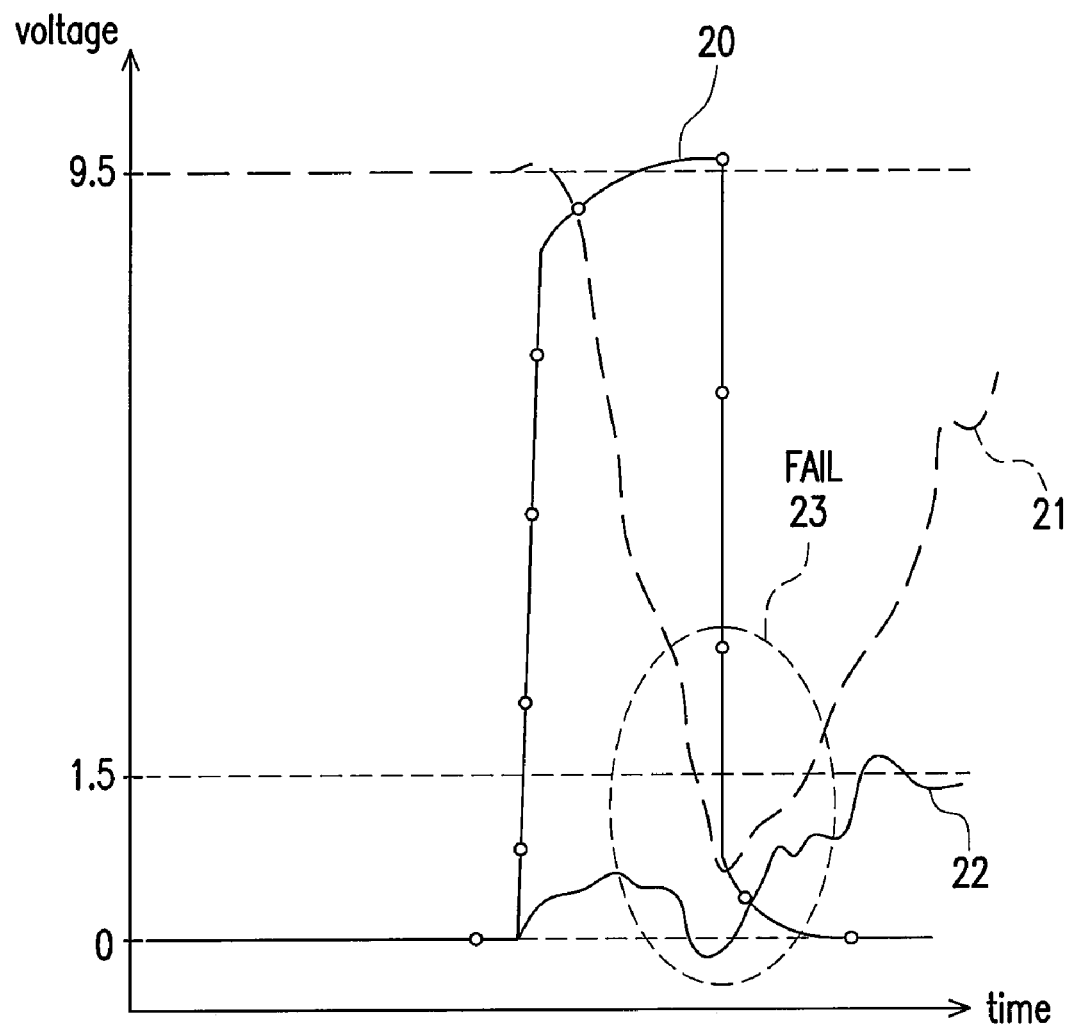
FIG. 2 is a plot diagram showing the waveforms of the first and second output signal when the level shift circuit fails.

Reference will now be made in detail to the present preferred embodiment of the invention, examples of which are illustrated in the accompanying drawings. Wherever possible, the same reference numbers are used in the drawings and the description to refer to the same or like parts.

In order to solve these and other problems, the embodiment of the invention provides a level shift circuit and method thereof suitable for the condition with higher channels. The method and level shift circuit are simple to be implemented, and their hardware complexity and manufacturing cost are low.

Figure 3A:
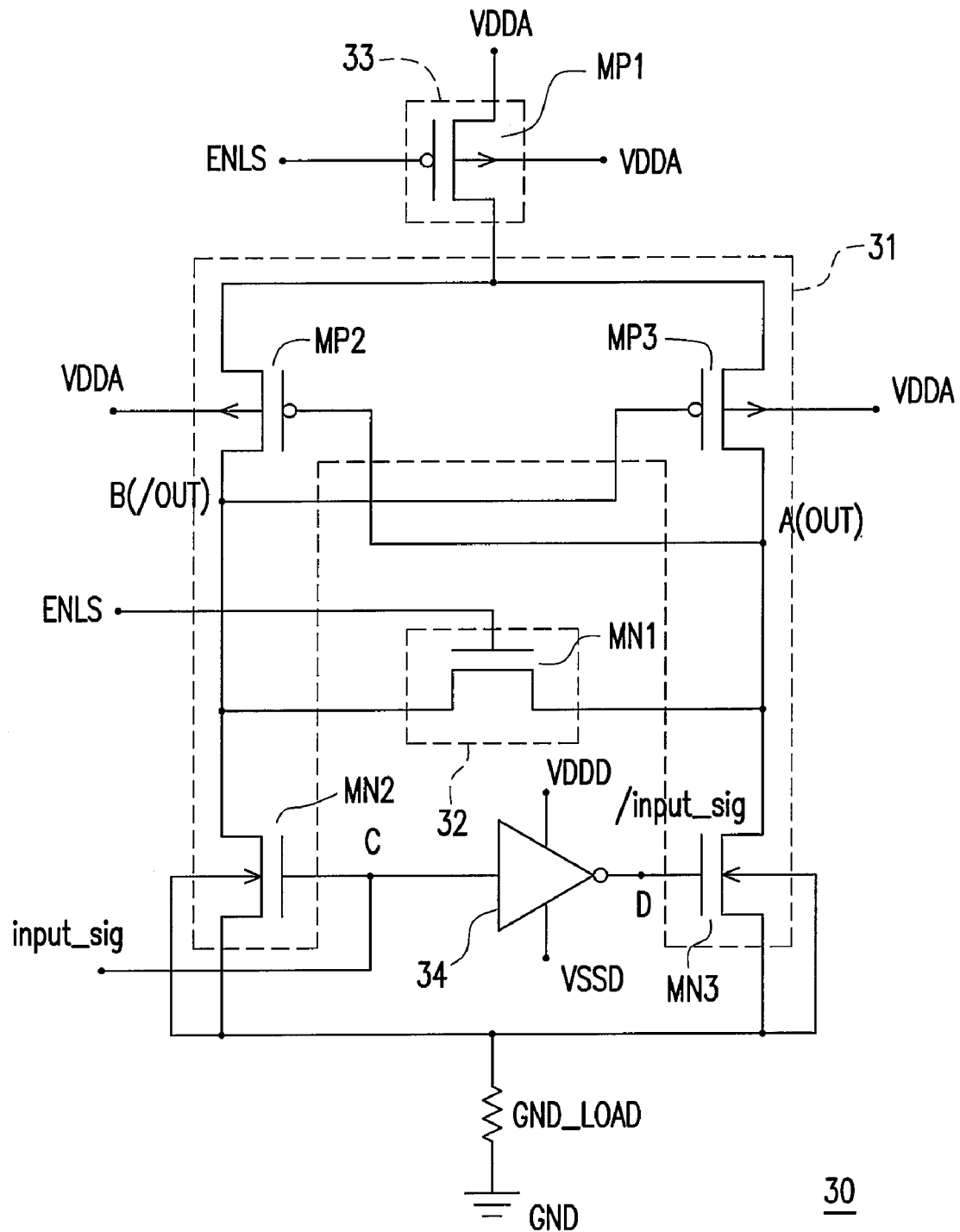
FIG. 3A is a schematic diagram showing a level shift circuit 30 according to one embodiment of the present invention.

FIG. 3A is a schematic diagram showing a level shift circuit 30 according to one embodiment of the present invention. The level shift circuit 30 comprises a first input terminal C, a second input terminal D, a first output terminal A, a second output terminal B, a level shifter 31, an equalization unit 32, and a control unit 33. The equalization unit 32 is a transistor for example.

The level shifter 31 is coupled to the control unit 33, the first input terminal C, the second input terminal D, the first output terminal A, and the second output terminal B. The equalization unit 32 is coupled between the first output terminal A and the second output terminal B.

The first input terminal C receives an input signal input_sig, and the second input terminal D receives an inverted input signal /input_sig which is generated by the inverter 34 and is an inverse of the input signal input_sig. The first output terminal A outputs an output signal OUT, and the second output terminal B outputs an inverted output signal /OUT.

The level shifter 31 is used for level shifting the input signal input_sig. The equalization unit 32 and the control unit 33 are controlled by an enable signal ENLS. The control unit 33 is used to control whether the level shifter 31 is enabled or disabled, that is, the control unit 33 selectively connects the level shifter 31 to the power VDDA.

At a reset phase, the input signal input_sig and the inverted input signal /input_sig are inputted to the level shifter 31 and the enable signal ENLS is asserted at a high level, such that the level shifter 31 is disabled and the equalization unit 32 is turned on. Thus the first output terminal A and the second output terminal B are electrically connected and have the same voltage level. After the reset phase, the enable signal ENLS is asserted at a low level such that the equalization unit 32 is turned off and the level shifter 31 is enabled to shift the level of the input signal input_sig.

Figure 3B:
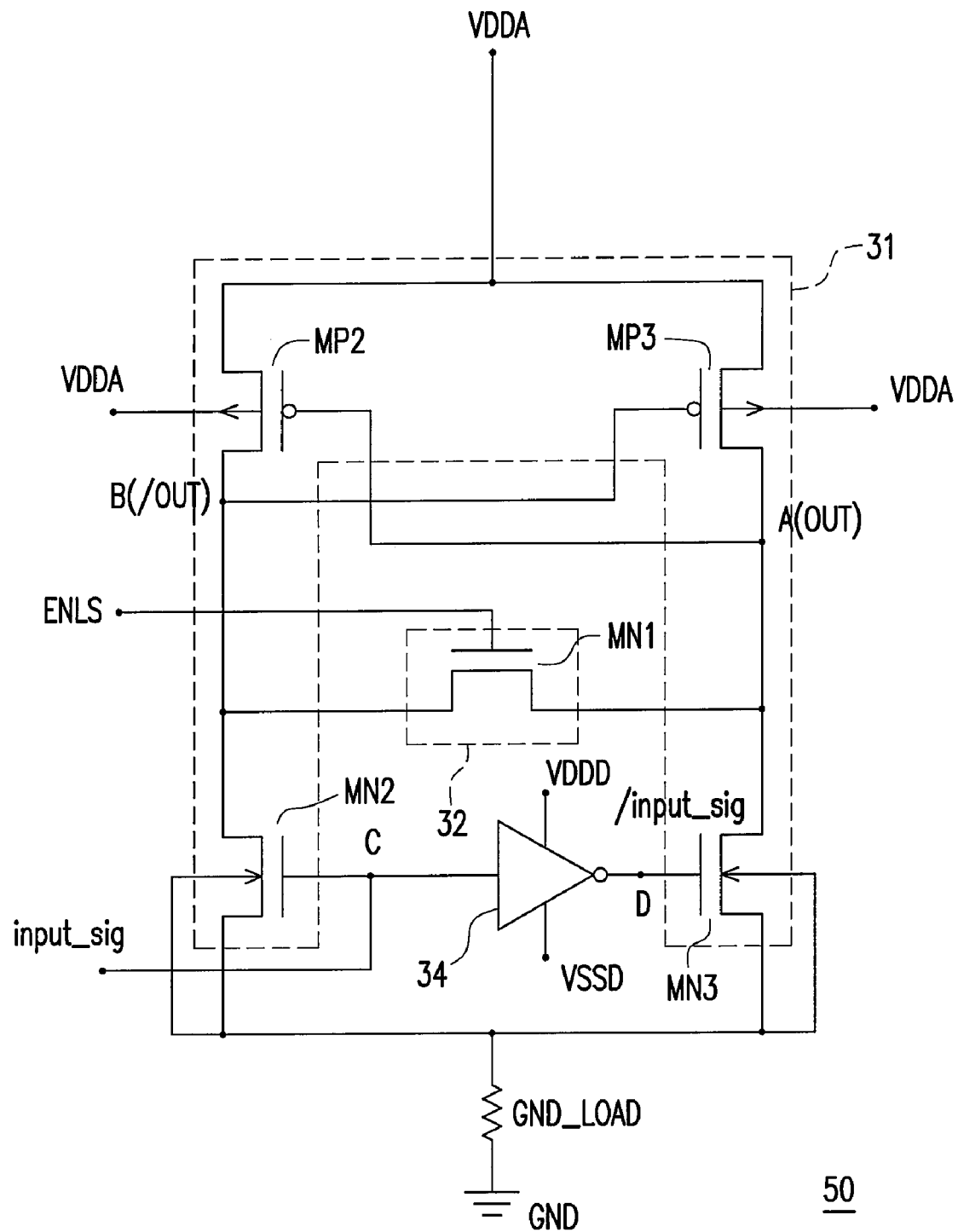
FIG. 3B is a schematic diagram showing a level shift circuit 50 according to another embodiment of the present invention.

In this embodiment, the control unit 33 is a P-MOS transistor MP1. The gate end of the transistor MP1 receives the enable signal ENLS, the source end of the transistor MP1 is coupled to the power VDDA, and the drain end of the transistor MP1 is coupled to the level shifter 31. The control unit 33 is not intended to limit the scope of the invention. FIG. 3B is a schematic diagram showing a level shift circuit 50 according to another embodiment of the present invention. The control unit 33 is removed or modified for the requirement of the applications in this embodiment. The other elements of the level shift circuit 50 are same as the elements of the level shift circuit 30, and are not described again.

With the equalization unit 32, when the enable signal ENLS is high, the charges on the first output terminal A and the second output terminal B are shared by each other. Thus the output signal OUT and the inverted output signal /OUT are equalized to have the same voltage level by the equalization unit 32. In the both embodiments of FIGS. 3A and 3B, the equalization unit 32 comprises a NMOS transistor MN1. The source end and the drain end of the transistor MN1 are coupled to the first and second output terminals A and B respectively. The gate end of the transistor MN receives the enabled signal ENLS. However, this implementation of the equalization unit 32 is not intended to limit the scope.

In the both embodiments of FIGS. 3A and 3B, the level shifter 31 comprises two N-MOS transistors MN2, MN3, and two P-MOS transistors MP2, MP3. The gate end of transistor MN2 is coupled to the first input terminal C, and the gate end of the transistor MN3 is coupled to the second input terminal D. The two source ends of the transistors MN2, MN3 are commonly connected. The parasitic resistor GND_LOAD emulates the ground loading. The gate end of the transistor MP2 is coupled to the first output terminal A and the drain end of the transistor MP3. The gate end of the transistor MP3 is coupled to the second output terminal B and the drain end of the transistor MP2. In FIG. 3A, the two source ends of the transistors MP2 and MP3 are commonly connected to the control unit 33, while in FIG. 3B, the two source ends of the transistors MP2 and MP3 are commonly connected to the supply voltage VDDA.

Figure 4:
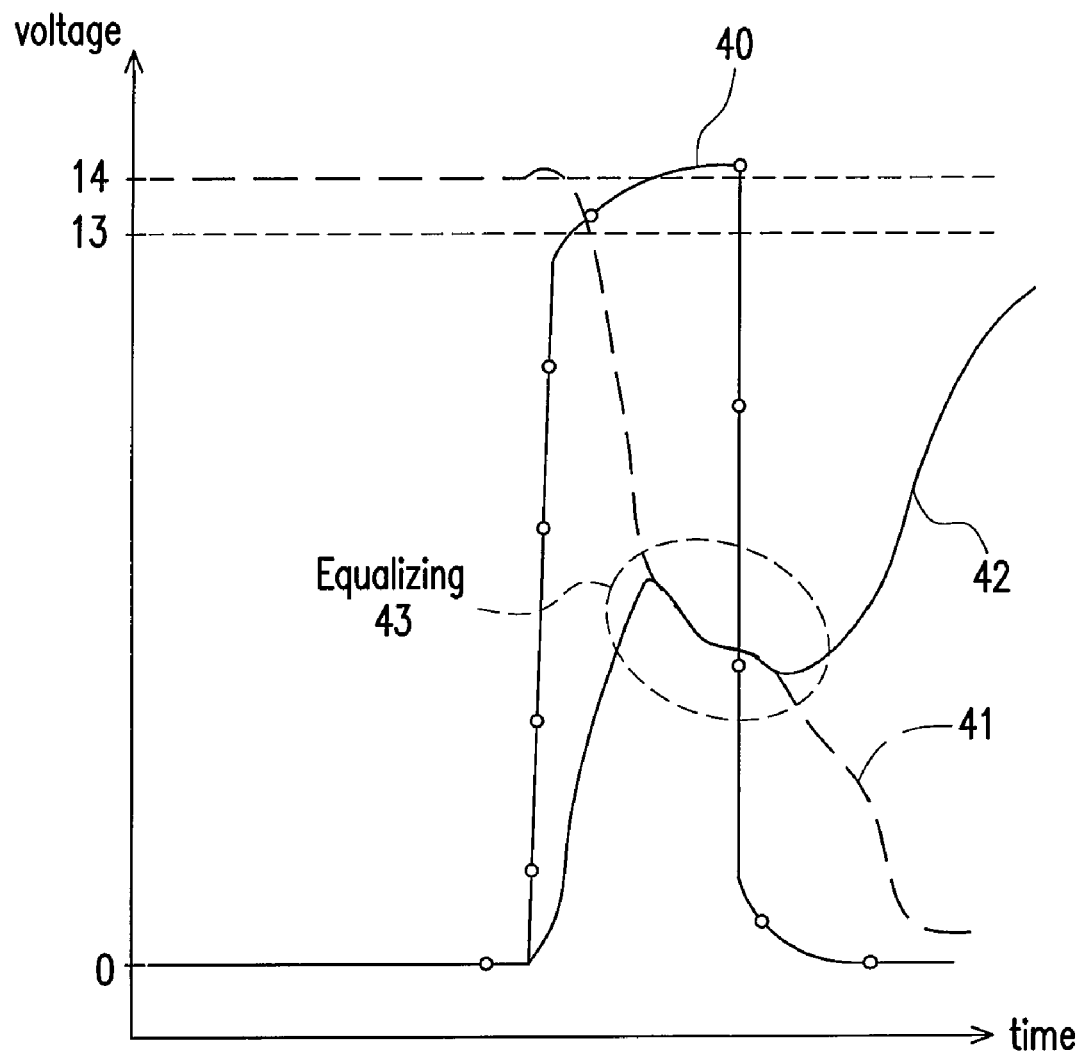
FIG. 4 is a plot diagram showing the waveforms of the output signal OUT and the inverted output signal /OUT.

FIG. 4 is a plot diagram showing the waveforms of the output signal OUT and the inverted output signal /OUT of the level shift circuit 30 in FIG. 3A. The charges on the first output terminal A and the second output terminal B are shared by each other (see the circle mark 43). The curve 40 represents the enable signal ENLS. The curve 41 represents the output signal OUT on the first output terminal A, and the curve 42 represents the inverted output signal /OUT on the second output terminal B.

In FIG. 4, the input signal input_sig is changing from the logic high to the logic low. While the enable signal ENLS is at the high level, the equalization unit 32 is turned on such that the output signal OUT and the inverted output signal /OUT are electrically connected and have the same voltage level. After the enable signal ENLS falls low, the equalization unit 32 is turned off, since MN3 is ON and MN2 is off with MP2 and MP3 at the same initial state, the output signal OUT is pulled lower than the output signal /OUT (see the circle mark 43, and the curves 41 and 42). After positive feedback of MN2, MN3, MP2 and MP3, the output signal OUT changes to the low level, and the inverted signal /OUT changes to the high level. Thus the transition of the level shift circuit 30 is successfully completed.

The level shift circuits and method thereof according to the embodiments of the invention is suitable for source drivers with more number of channels, and the parasitic ground loading is less influential. The method and level shift circuit are simple to be implemented, and their hardware complexity and manufacturing cost are low.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A level shift circuit comprises:
   a first input terminal, for receiving an input signal;
   a second input terminal, for receiving an inverted input signal which is an inverse of the input signal;
   a first output terminal, for outputting an output signal;
   a second output terminal, for outputting an inverted output signal;
   a level shifter, connected to the first input terminal, the second input terminal, the first output terminal and the second output terminal;
   a control unit, coupled between a power supply and the level shifter, controlled by an enable signal; and
   an equalization unit, coupled between the first output terminal and the second output terminal;
   wherein at a reset phase, the input signal and the inverted input signal are inputted to the level shifter, and the equalization unit is turned on;
   wherein after the reset phase, the equalization unit is turned off and the level shifter starts to shift a level of the input signal.

2. The level shift circuit as claimed in claim 1, wherein the equalization unit is a first transistor which has a first gate end for receiving the enable signal.

3. The level shift circuit as claimed in claim 1, wherein at the reset phase, the level shifter is disabled by the control unit; after the reset phase, the level shifter is enabled by the control unit.

4. The level shift circuit as claimed in claim 1, wherein the control unit is a second transistor which has a second gate end for receiving the enable signal and selectively providing a power to the level shifter.

5. The level shift circuit as claimed in claim 1, wherein the level shifter comprises:
   a third transistor, having a third gate end connected to the first input terminal;
   a fourth transistor, having a forth gate end connected to the second input terminal;
   a fifth transistor, having a fifth drain end and a fifth gate end;
   a sixth transistor, having a sixth gate and a sixth drain end;
   wherein the fifth gate end is coupled to the sixth drain end and the first output terminal, the sixth gate end is coupled to the fifth drain end and the second output terminal, the third transistor and the forth transistor are commonly coupled to a ground, and the fifth transistor and the sixth transistor are commonly connected to the control unit.

6. A method used in a level shift circuit for level shifting comprises:
   receiving an input signal and an inverted input signal with respect to a first and a second input terminal, wherein the inverted input signal is an inverse of the input signal;
   providing a first output terminal and a second output terminal, wherein the first output terminal is used to output an output signal and the second output terminal is used to output an inverted output signal;
   providing a level shifter which is connected to the first input terminal, the second input terminal, the first output terminal and the second output terminal;
   electrically connecting the first output terminal and the second output terminal by turning on an equalization unit and disconnecting the level shifter from a power supply at a reset phase; and
   after the reset phase, turning off the equalization unit and shifting levels of the input signal and the inverted input signal for outputting the output signal and the inverted output signal.

7. The method as claimed in claim 6, wherein after the reset phase, the method further comprises a step of connecting the level shifter to the power supply.

8. The method as claimed in claim 7, wherein the level shift circuit further comprises a control unit, and the steps of connecting and disconnecting the level shifter to and from the power are done by the control unit.

* * * * *